(12) United States Patent
Ishii et al.

(10) Patent No.: US 7,467,171 B2
(45) Date of Patent: Dec. 16, 2008

(54) DIGITAL FILTER DEVICE

(75) Inventors: Yuji Ishii, Yokohama (JP); Kenji Rikimaru, Yokohama (JP); Kazuyuki Mori, Kawasaki (JP); Yuji Tochio, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 668 days.

(21) Appl. No.: 10/647,073

(22) Filed: Aug. 22, 2003

(65) Prior Publication Data
US 2004/0107232 A1    Jun. 3, 2004

(30) Foreign Application Priority Data
Aug. 22, 2002    (JP)    ............ 2002-241865

(51) Int. Cl.
*G06F 17/10*    (2006.01)
(52) U.S. Cl. ................... 708/300
(58) Field of Classification Search ......... 708/300–323
See application file for complete search history.

(56) References Cited

U.S. PATENT DOCUMENTS

| | | | | |
|---|---|---|---|---|
| 4,805,129 A | * | 2/1989 | David ................... | 708/300 |
| 4,939,684 A | * | 7/1990 | Gehrig et al. ........... | 708/303 |
| 5,262,972 A | * | 11/1993 | Holden et al. ........... | 708/316 |
| 5,311,459 A | * | 5/1994 | D'Luna et al. .......... | 708/607 |
| 5,586,068 A | * | 12/1996 | Rakib ..................... | 708/319 |
| 5,898,731 A | * | 4/1999 | Kwak ..................... | 375/230 |
| 6,018,755 A | * | 1/2000 | Gonikberg et al. ...... | 708/319 |
| 6,510,444 B2 | * | 1/2003 | Mackre et al. .......... | 708/303 |

FOREIGN PATENT DOCUMENTS

| | | |
|---|---|---|
| JP | 63-132517 | 6/1988 |
| JP | 2-121513 | 5/1990 |

OTHER PUBLICATIONS

Notification of Reason(s) for Refusal dated Sep. 9, 2008, from the corresponding Japanese Application.

* cited by examiner

*Primary Examiner*—Chat C Do
(74) *Attorney, Agent, or Firm*—Katten Muchin Rosenman LLP

(57) ABSTRACT

In a digital filter device which filters a plurality of signals by a single digital filter, an input data memory stores the input data strings generated by computing processors, and a digital filter reads the input data strings in a predetermined sequence to be filtered and generates output data strings. An output data memory stores the output data strings, and a data processor reads the output data strings in a predetermined sequence to be processed. Furthermore, a filter memory and coefficient memories respectively store data-under-calculation and a filter coefficient in a delay circuit included in the digital filter.

4 Claims, 11 Drawing Sheets

FIG.4A
PROCESSING CYCLE
ADDRESS 710
(INPUT DATA MEMORY
READ ADDRESS)

| ADDRESS 0 | ADDRESS 1 | ADDRESS 2 | ADDRESS 3 | ADDRESS 4 | ADDRESS 5 | ADDRESS 6 | ADDRESS 7 |

FIG.4B
SWITCH TABLE READ
ADDRESS 711

| 0 | 1 | 2 | 3 | 4 | 5 | 6 | ... |

FIG.4C
SWITCH TABLE DATA 712
(OUTPUT DATA MEMORY
WRITE ADDRESS)

| MIRROR 131_1 | MIRROR 151_64 | MIRROR 131_2 | MIRROR 151_8 | ... | ... | ... | ... |

FIG.4D
FILTER MEMORY
WRITE ADDRESS 713
READ ADDRESS 714

| MIRROR 131_1 | MIRROR 151_64 | MIRROR 131_2 | MIRROR 151_8 | ... | ... | ... | ... |

FIG.4E
WRITE DATA 715 OF
FILTER MEMORY

| DATA-UNDER-CALCULATION FOR MIRROR 131_1 | DATA-UNDER-CALCULATION FOR MIRROR 151_64 | DATA-UNDER-CALCULATION FOR MIRROR 131_2 | DATA-UNDER-CALCULATION FOR MIRROR 151_8 | ... | ... | ... | ... |

FIG.4F
READ DATA 716 OF
FILTER MEMORY

| LAST DATA-UNDER-CALCULATION FOR MIRROR 131_1 | LAST DATA-UNDER-CALCULATION FOR MIRROR 151_64 | LAST DATA-UNDER-CALCULATION FOR MIRROR 131_2 | LAST DATA-UNDER-CALCULATION FOR MIRROR 151_8 | ... | ... | ... | ... |

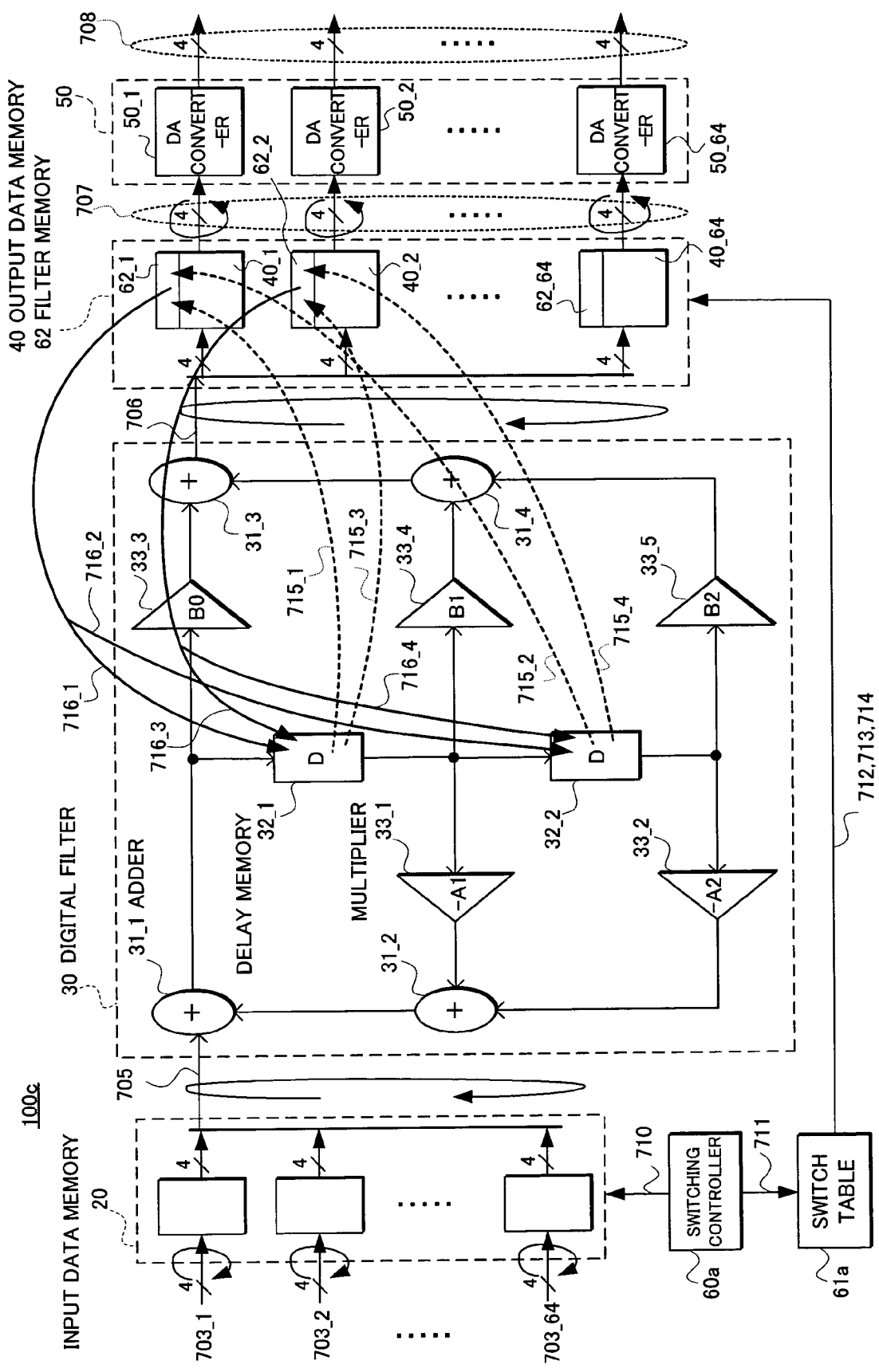

US 7,467,171 B2

DIGITAL FILTER DEVICE

BACKGROUND OF THE INVENTION

1. Field of the Invention

The present invention relates to a digital filter device, and in particular to a digital filter device for filtering a plurality of signals with a single digital filter.

With an advanced digital signal processing technology in recent years, a digital filter is indispensable for general fields of technology such as communications and controls. It is possible to filter a plurality of signals (data strings) with a single digital filter commonized, i.e. made in common. This filtering is required corresponding to a characteristic of a signal to be processed.

2. Description of the Related Art

FIG. 7 shows a signal processing circuit (digital filter) 90 disclosed in Japanese Patent Application Laid-open No.11-220355 as a prior art example (1). This signal processing circuit 90 comprises a signal time-division multiplexer 91 for time-division multiplexing a plurality of digital signals (input signal 803, re-input signal 805), and a multiplexing filter portion 92 for performing plural kinds of filterings commonized within a sampling period for the above time-division multiplexing.

Furthermore, the signal processing circuit 90 comprises a signal detector 93 which detects and temporarily holds the re-input signal 805 from an output signal 807 of the multiplexing filter portion 92 with a timing of the above time-division multiplexing, and feeds it back to the signal time-division multiplexer 91 to be used for the next filtering. This signal detector 93 provides a desired final output signal 808.

Furthermore, the signal processing circuit 90 comprises a timing generator 94 which inputs a clock 804 to provide a timing pulse 806 to the multiplexing filter portion 92 and the signal detector 93.

Namely, by the signal detector 93 feeding back the re-input signal 805 obtained by filtering the input signal 803 to the signal time-division multiplexer 91, the multiplexing filter portion 92 can perform plural kinds of filterings commonized with respect to the input signal 803 within one sampling period.

FIG. 8 shows a digital filter 80 disclosed in Japanese Patent Application Laid-open No.63-141406 as a prior art example (2). This digital filter 80 performs a time-division multiplexed filtering with latch circuits 81_1, 81_2 which input and time-divide a plurality of input data strings (two input signals 800_1, 800_2 in FIG. 8) to reduce the data width to one of the time-divided number to be outputted, and delay circuits 83_1-83_4 which delay latch outputs (3 state output in FIG. 8) of the latch circuits 81_1, 81_2 by a time width of a sample clock corresponding to the above-reduced data width.

Namely, the input signals 800_1, 800_2 respectively latched by the latch circuits 81_1, 81_2 are inputted to the delay circuit 83_1 by turns in the form of the input signal 801 via a wired OR circuit 82, and thereafter sequentially delayed by a time width of a sample clock to be shifted to the delay circuits 83_2-83_4.

Accordingly, the output signals of the wired OR circuit 82 and the delay circuits 83_2, 83_4 at a timing of a certain sample clock are respectively, for example, the input signal 800_1, the input signal 800_1 delayed by 2 sample clocks, and the input signal 800_1 delayed by 4 sample clocks. With these signals, computers 84_1, 84_2 perform filtering. The latch circuit 85_1 latches the computation 802 of the computer 84_2.

Similarly, at the next sample clock timing, the filtering operation of the input signal 800_2 is computed, the result of which is latched by the latch circuit 85_2.

A prior art example (3) in which the digital filter 80 shown in FIG. 8 is applied to controls of MEMS (Micro Electro Mechanical System) optical switch will now be described referring to FIGS. 9-11.

FIG. 9 shows a configuration example of a general 64 ch×64 ch MEMS optical switch. This MEMS optical switch is composed of a collimator array 140 arranged on the input side consisting of the collimators 141_1-141_64, a mirror array 130 arranged on the input side consisting of mirrors 131_1-131_64 (hereinafter, occasionally represented by a reference 131), a mirror array 150 arranged on the output side consisting of mirrors 151_1-151-64 (hereinafter, occasionally represented by a reference 151), and a collimator array 160 arranged on the output side consisting of collimators 161_1-161_64.

The collimators 141_1-141_64 and the mirrors 131_1-131_64 respectively correspond to input channels ch1-ch64, and the mirrors 151_1-151_64 and the collimators 161_1-161_64 respectively correspond to output channels ch1-ch64.

FIG. 10 shows an arrangement of mirror control electrodes in a general MEMS optical switch, and particularly electrodes of the input side mirror 131_1 and the output side mirror 151_8. The electrodes of the input side mirror 131_1 are composed of electrodes x1(−), x1(+), and electrodes y1(−), y1(+), and the electrodes of the output side mirror 151_8 are composed of electrodes x2(−), x2(+), and electrodes y2(−), y2(+).

The case where an optical signal of the input channel ch1 is switched to the output channel ch8 will now be described.

An optical signal 700a from the collimator 141_1 of the input channel ch1 irradiates the input side mirror 131_1. The electrode x1(+) of the input side mirror 131_1 is applied with a voltage to tilt the mirror 131_1 by an electrostatic effect, whereby an optical signal 700b reflected by the mirror 131_1 is irradiated to the mirror 151_8 of the output channel ch8.

Also, the electrode x2(+) of the mirror 151_8 is applied with a voltage, whereby an optical signal 700c reflected by the mirror 151_8 is irradiated to the collimator 161_8 of the output channel ch8. At this moment, without radiations of the optical signal 700c perpendicular onto the collimator 161_8, the optical loss will be increased.

When the optical signal of the input channel ch1 is switched to the output channel ch64, in FIG. 9, the electrodes x1(+) and y1(−) of the input side mirror 131_1 are applied with voltages, an optical signal 700d reflected by the mirror 131_1 is irradiated onto the mirror 151_64 of the output channel ch64.

Moreover, the electrodes x3(+) and y3(−) (not shown) of the mirror 151_64 are applied with voltages, whereby an optical signal 700e reflected by the mirror 151_64 is irradiated onto the collimator 161_64 of the output channel ch64.

Thus, switching over the optical routes by controlling the mirror angles, the MEMS optical switch requires no conversion from optical signals to electrical signals, has no dependencies on wavelength and polarization, and is small-sized. To this end, the MEMS optical switch receives attention as an exceeded switch in the application thereof to WDM (Wavelength Division Muliplex) network.

However, the mirrors 131, 151 have a transient characteristic such as resonance due to mechanical characteristics. This transient characteristic causes an increased switchover time of the MEMS optical switch.

FIG. 11 shows a MEMS optical switch control circuit, as a prior art example (3), using a digital filter for minimizing the above-noted switchover time.

This control circuit is composed of an open control portion for designating the angles of the mirrors 131, 151 and a feedback control portion for feeding back the control result to the open control portion.

The open control portion comprises computing processors $10z\_1$-$10z\_64$ (hereinafter, occasionally represented by a reference $10z$) for generating the digital data (four data: data of 256 (=64×4) in total), corresponding to the channels ch1-ch64) for controlling the mirrors 131, 151 respectively, latch circuits $81z\_1$-$81z\_64$ (hereinafter, occasionally represented by a reference $81z$) for latching those data, a selector $87z$ for outputting a digital filter input signal $801z$ obtained by sequentially selecting, on a time-division basis, the data latched by the latch circuits $81z\_1$-$81z\_64$, a digital filter $80z$ for generating an output signal $802z$ obtained by filtering, on a time-division basis, the input signal $801z$, and latch circuits $85z\_1$-$85z\_64$ for sequentially latching, on a time-division basis, the output signal $802z$.

The digital filter $80z$ is different in configuration from the digital filter 80 shown in FIG. 8, but both are basically the same in operation in that the former comprises the delay circuits $88\_1$-$88\_256$ and $89\_1$-$89\_256$ corresponding to 256 data (channel number "64"× control number "4") latched by the latch circuit $81z$.

Namely, for example, one of four data latched by the latch circuit $81z\_1$ is added at an adder $31\_1$, and then shifted to the delay circuits $88\_1$-$88\_256$ and $89\_1$-$89\_256$ by the clock. At the shift timings to the delay circuits $88\_256$, $89\_256$, the filter output signal $802z$ filtered corresponding to the data of the latch circuit $81z\_1$ is outputted from an adder $31\_3$ to be latched by the latch circuit $85z\_1$.

Similarly, the data obtained by filtering the data of the latch circuits $81z\_2$-$81z\_64$ are respectively latched by the latch circuits $85z\_2$-$85z\_64$.

The control circuit further comprises DA converters $50\_1$-$50\_64$ (hereinafter, occasionally represented by a reference 50) for converting into analog signals respectively the data latched by the latch circuits $85z\_1$-$85z\_64$, and drivers $110\_1, \ldots, 110\_64, 111\_1, \ldots, 111\_64$ (hereinafter, occasionally represented by references 110, 111) for driving the mirrors 131, 151 based on the converted analog output signal 708.

In operation, the computing processor $10z$ computes data for driving the mirrors 131, 151. The data are filtered, on a time-division basis, by the digital filter $80z$. This digital filter $80z$ is set to have the minimum operation time of the mirrors 131, 151, that is the minimum switchover time of the optical switch. The filtered data are converted into an analog signal by the DA converter 50 and is provided to the drivers 110, 111, which drive the mirrors 131, 151.

The feedback control portion is composed of optical level detectors $170\_1$-$170\_64$ (hereinafter, occasionally represented by a reference 170) for detecting the levels of the optical signals $700\_1$ (ch1)-$700\_64$ (ch64) of the output channels ch1-ch64 respectively, and AD converters $180\_1$-$180\_64$ for converting the detected optical level into digital data to be provided to the computing processors $10z\_1$-$10z\_64$.

In operation, the optical level signal 701 of the output channels ch1-ch64 respectively detected by the optical level detector 170 are provided to the computing processor $10z$ as a digital signal 702 ($702\_1$-$702\_64$) converted from the analog signal.

Namely, the operated angle data of the mirrors 131, 151 are fed back to the computing processor $10z$. The computing processor $10z$ corrects the input signal (mirror control data) $800\_1$-$800\_64$ so that deviations of the optical signal $700\_1$-$700\_64$ caused by mechanical and electrical errors of the mirror may be amended.

If various digital filters as above-noted are provided respectively for input data from several hundreds of channels, the required hardware is quite large-sized, resulting in a disadvantageous cost, consumption power, and mounting area.

This enlarges the circuit size of the multiplier, adder, and delay circuits required for filtering as the bit width of the input data increases, resulting in much more disadvantages.

Furthermore, it is said to be impossible to provide digital filters respectively for input data from 1000 and more channels. Therefore, it becomes necessary to commonize the above-noted digital filters, with time-division multiplexing.

However, the prior art signal processing circuit (digital filter) shown in FIG. 7 is suitable for the filtering upon a completed processing within one sampling period, while it is not suitable for the filtering upon uncompleted processing within one sampling period.

Namely, since the delay circuit (not shown) included in the multiplexing filter portion 92 of the signal processing circuit has no residual data necessary for the next filtering when the processing is uncompleted within one sampling period, no continuity can be kept for the output data strings as filtered.

Also, the digital filter shown in FIG. 8 and the digital filter employed in FIG. 11 require internal delay circuits and latch circuits on the input side respectively by the number of input channels. Therefore, this type of digital filter assumes a large-sized circuit for the filtering over e.g. 1000 channels, resulting in inadequate usages.

This type of digital filter also requires to make a unit time delay by the delay circuit with the same timing as the time-division processing, so that it can not perform the filtering for e.g. time-divided data fluctuating in periodicity such as data collected from IP networks, or data with the sequence or order of plural channels time-divided being exchanged.

Furthermore, this type of digital filter can not set the filter coefficient for each mirror to provide an optimum response characteristic for each mirror when the characteristics of the mirrors are different from each other.

SUMMARY OF THE INVENTION

It is accordingly an object of the present invention to provide a digital filter device for filtering a plurality of signals with a single digital filter, wherein the number of channels (data strings) to be filtered is easily changed in terms of design, a filtering sequence over plural channels can be changed, filtering continuity is kept, and a filtering characteristic can be changed corresponding to each channel.

In order to achieve the above-mentioned object, a digital filter device according to the present invention comprises: one or more computing processors for generating input data strings; an input data memory for storing the input data strings; and a digital filter for reading the input data strings out of the input data memory in a predetermined order to be filtered and for generating output data strings.

Namely, a computing (arithmetic) processor generates a plurality of input data strings. Only a single computing processor may generate these input data strings, or each of computing processors may generate one or more input data strings.

An input data memory stores the input data strings generated by the computing processor. A digital filter reads and filters the input data strings stored in the input data memory in a predetermined sequence and generates filtered output data strings.

Thus, it becomes possible to separate an operation timing with which the computing processor generates the input data strings from an operation timing with which the digital filter filters the input data strings.

Accordingly, when the filtering by the digital filter is performed at a higher speed compared with a generation speed of the input data strings at each computing processor, it becomes possible to filter a plenty of input data strings within a single sampling period of the digital filter.

It is also possible, for example, to sequentially filter a plurality of input data strings within a single sampling period of the digital filter, to change a filtering sequence of the input data strings, and to skip or to perform plural times filtering a certain input data string within a certain single sampling period of the digital filter.

Also, it becomes unnecessary to strictly synchronize the operation timing of the computing processor with that of the digital filter, and it becomes easy to facilitate designing the digital filter device (timing design, circuit design, or the like), adding a computing processor, and controlling the number of input data strings (channels).

Also, the present invention may further comprise; an output data memory for storing the output data strings generated by the digital filter, and a data processor for reading the output data strings stored in the output data memory in a predetermined order to be processed.

Namely, an output data memory stores the output data strings generated by the digital filter. A data processor such as a DA converter reads the output data strings out of the output data memory in a predetermined sequence, to which data processing is performed.

Thus, it becomes possible to separate a timing with which the digital filter filters the input data strings from a timing with which the data processor processes the output data strings.

Accordingly, the data processor can sequentially process a plurality of output data strings, change a processing sequence of the output data strings, and skip or perform plural times data processing of a certain output data string within a certain single period.

Also, it becomes unnecessary to strictly synchronize the timing of the digital filter with that of the data processor, and it becomes easy to facilitate designing the digital filter device (timing design, circuit design, or the like), and controlling the number of output data strings (channels) of the data processor.

Also, the present invention may further comprise; a switch table for associating an address of the input data memory in which the input data strings are stored with an address of the output data memory in which the output data strings are stored, and a switching controller for providing timings of reading the input data strings out of the input data memory based on the switch table and of writing the input data strings as the output data strings into the output data memory through the digital filter.

Namely, a switch table associates an address of the input data memory in which the input data strings are stored, with an address of the output data memory in which the output data strings are stored.

A switching controller performs a switching (timing) control of reading the input data strings out of the input data memory based on the switch table and of providing the input data strings as the output data strings to the output data memory through the digital filter.

Thus, it becomes possible to designate or change the sequence of filtering the input data strings based on the switch table.

Also, it becomes possible to switch the output data strings to a predetermined data processor corresponding to the input data strings.

Also, the present invention may further comprise; a filter memory for storing data-under-calculation upon filtering for a first input data string before filtering for a second input data string from filtering for the first input data string, in a delay circuit included in the digital filter, and for restoring the data-under-calculation to the delay circuit when filtering the input data string subsequent to the first input data string is started.

The digital filter includes a delay circuit. A filter memory stores data-under-calculation, in the delay circuit, upon filtering for a first input data string before filtering for a second input data string from filtering for the first input data string.

The filter memory restores the data-under-calculation stored when the filtering for the input data string subsequent to the first input data string is started, to the delay circuit.

Thus, it becomes possible to keep continuity of the filtered output data strings by restoring the data of the delay circuit stored in the filter memory to the delay circuit, when the digital filter, for example, shifts from a filtering state for the first input data string to a filtering state for the second input data string and to a filtering stop state for the first input data string, and then returns to the filtering state subsequent to the first input data string.

Also, the present invention may further comprise; one or more coefficient memories for storing a filter coefficient corresponding to each input data string of the digital filter, and a filter coefficient corresponding to an input data string to be filtered may be set in the digital filter.

Namely, a coefficient memory stores one or more filter coefficients corresponding to the input data string (channel). The filter coefficient set in the digital filter is changed to one corresponding to the input data string filtered every time the input data string changes.

Thus, filtering corresponding to each input data string is made possible.

In order to achieve the above-mentioned object, a digital filter device according to the present invention alternatively comprises: an input data memory for storing input data strings; a digital filter for generating output data strings which are obtained by filtering the input data strings, inputted from the input data memory, and an output data memory for storing the output data strings.

Namely, an input data memory stores a plurality of input data strings.

A digital filter generates output data strings which are obtained by filtering the input data strings in a predetermined sequence. An output data memory stores the output data strings.

Thus, it becomes possible to separate a timing with which the input data strings are written into the input data memory from a timing with which the digital filter filters the input data strings.

Also, it becomes possible to separate a timing with which the output data strings from the digital filter are written into the output data memory from a timing with which the output data strings are read out of the output data memory.

Accordingly, it becomes unnecessary to strictly synchronize the filtering timing of the digital filter with the write timing into the input data memory, and the filtering timing of the digital filter with the read timing out of the output data memory, and it becomes easy to facilitate designing the digital filter device (timing design, circuit design, or the like), and controlling the number of output data strings (channels) of the data processor.

Also, the present invention may further comprise; a switch table for associating an address of the input data memory in which the input data strings are stored with an address of the output data memory in which the output data strings are stored, and a switching controller for providing timings of reading the input data strings out of the input data memory based on the switch table and of writing the input data strings as the output data strings into the output data memory through the digital filter.

Namely, a switch table associates an address of the input data memory in which the input data strings are stored with an address of the output data memory in which the output data strings are stored.

A switching controller reads the input data strings out of the input data memory based on the switch table and provides an address storing the output data strings to the output data memory.

Thus, the digital filter device can designate or change the sequence of filtering the input data strings based on the switch table.

Also, it becomes possible to store the output data strings which are obtained by filtering the input data strings based on the switch table in a predetermined address of the output data memory, i.e. to perform switching.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which:

FIGS. 4A-4F are time charts showing operation timing examples in embodiments (2) and (3) of a digital filter device according to the present invention;

FIG. 5 is a block diagram showing an embodiment (3) of a digital filter device according to the present invention;

DESCRIPTION OF THE EMBODIMENTS

Embodiment (1)

Figure 1:
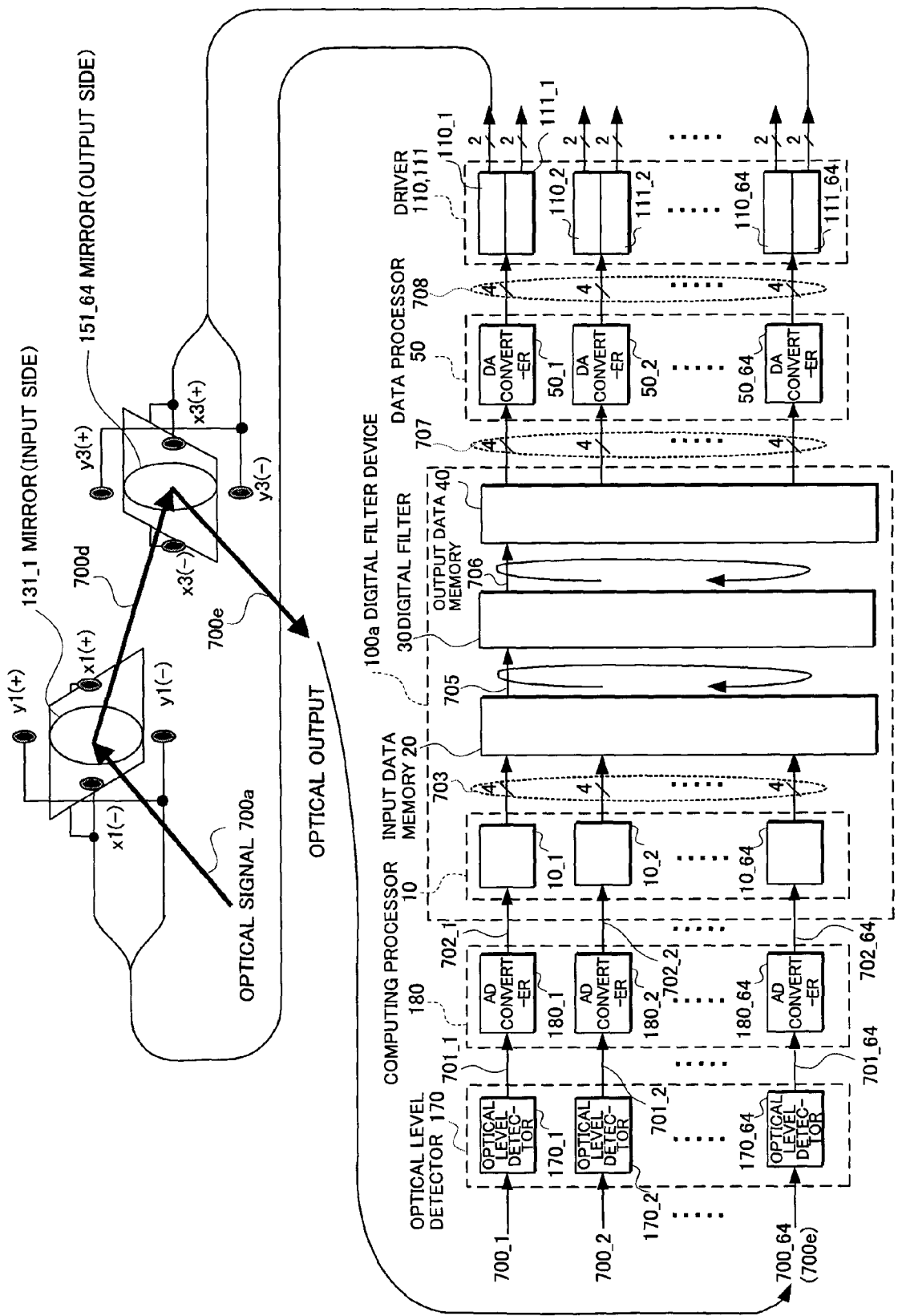
FIG. 1 is a block diagram showing an embodiment (1) of a digital filter device according to the present invention.

FIG. 1 shows an embodiment (1) of a digital filter device 100a according to the present invention. This embodiment (1) provides a case where the digital filter device 100a of the present invention is applied to an MEMS optical switch control circuit in the same way as the prior art digital filter shown in FIG. 11. It is to be noted that the present invention is not restricted to the MEMS optical switch control circuit.

Figure 11:
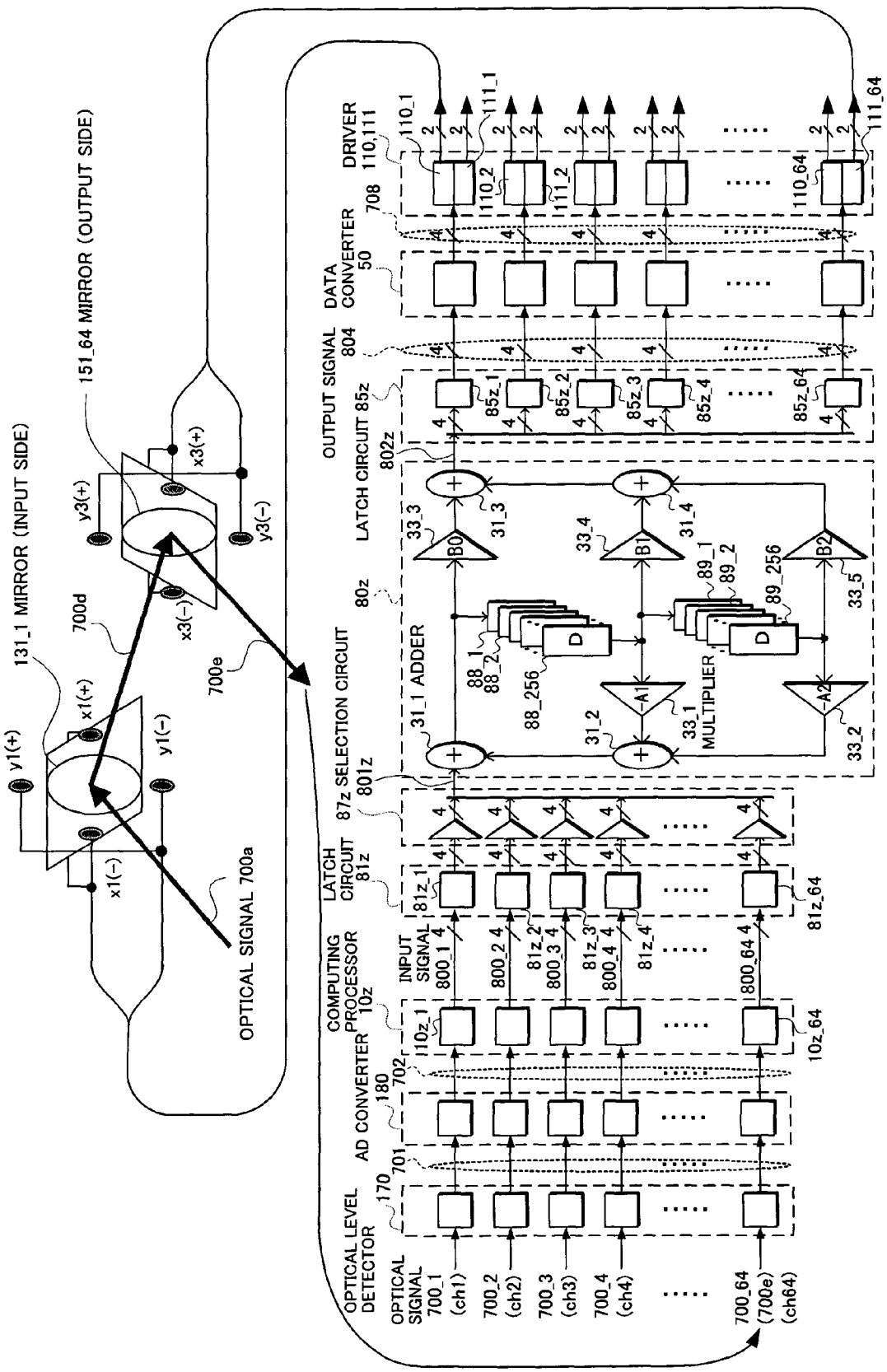
FIG. 11 is a block diagram showing an MEMS optical switch control circuit using a prior art digital filter.

The basic arrangement of the MEMS optical switch control circuit in FIG. 1 is the same as that of the control circuit shown in FIG. 11. However, they are different in that the digital filter device 100a according to the present invention is substituted for the digital filter 80z in FIG. 11.

The digital filter device 100a is composed of computing processors 10_1-10_64 (hereinafter, occasionally represented by a reference numeral 10) for generating input data strings, an input data memory 20 for storing input data strings 703 (703_1-703_64) generated, a digital filter 30 for filtering the stored input data strings 703 as an input signal 705, and an output data memory 40 for storing a filtered output signal 706 as output data strings.

The digital filter 30 is a conventional IIR type digital filter composed of input data memory adders 31_1-31_4, multipliers 33_1-33_5, and delay memories 32_1 and 32_2 for 1 channel, which will be described later as the digital filter 30 of FIG. 5. This digital filter 30 is different from the digital filter 80z having the delay circuits 88_1-88_256 and 89_1-89_256 for plural channels shown in FIG. 11.

It is to be noted that in the present invention the digital filter is not restricted to the IIR type digital filter.

In operation, the computing processor 10 generates the input data strings 703 for controlling mirrors 131 and 151 to be provided to the input data memory 20. This input data memory 20 sequentially stores the input data strings 703 in a predetermined address, and provides the stored input data strings 703 to the digital filter 30 as the input signal 705 in a predetermined sequence.

The digital filter 30 generates the output data strings that are the input data strings 703 filtered, as the output signal 706.

The output data memory 40 stores the output data strings in a predetermined address and provides the stored output data strings to DA converters 50_1-50_64 with a predetermined timing.

Subsequent operations of drivers 110, 111, mirrors 131, 151, and a feedback control operation through an optical level detector 170 and an AD converter 180 are the same as the operation of the prior art (3) shown in FIG. 11.

Thus, the digital filter device 100a of the present invention enables a timing with which the computing processor 10 generates the input data strings to be separated from a timing with which the digital filter 30 filters the input data strings by arranging the input data memory 20 between the computing processor 10 and the digital filter 30.

Also, it becomes possible to easily change a filtering sequence of the input data strings in the digital filter 30.

Also, it becomes possible to separate a timing with which the digital filter 30 filters the input data strings from a timing with which the DA converter (data processor) 50 processes output data strings 707.

Embodiment (2)

Figure 2:
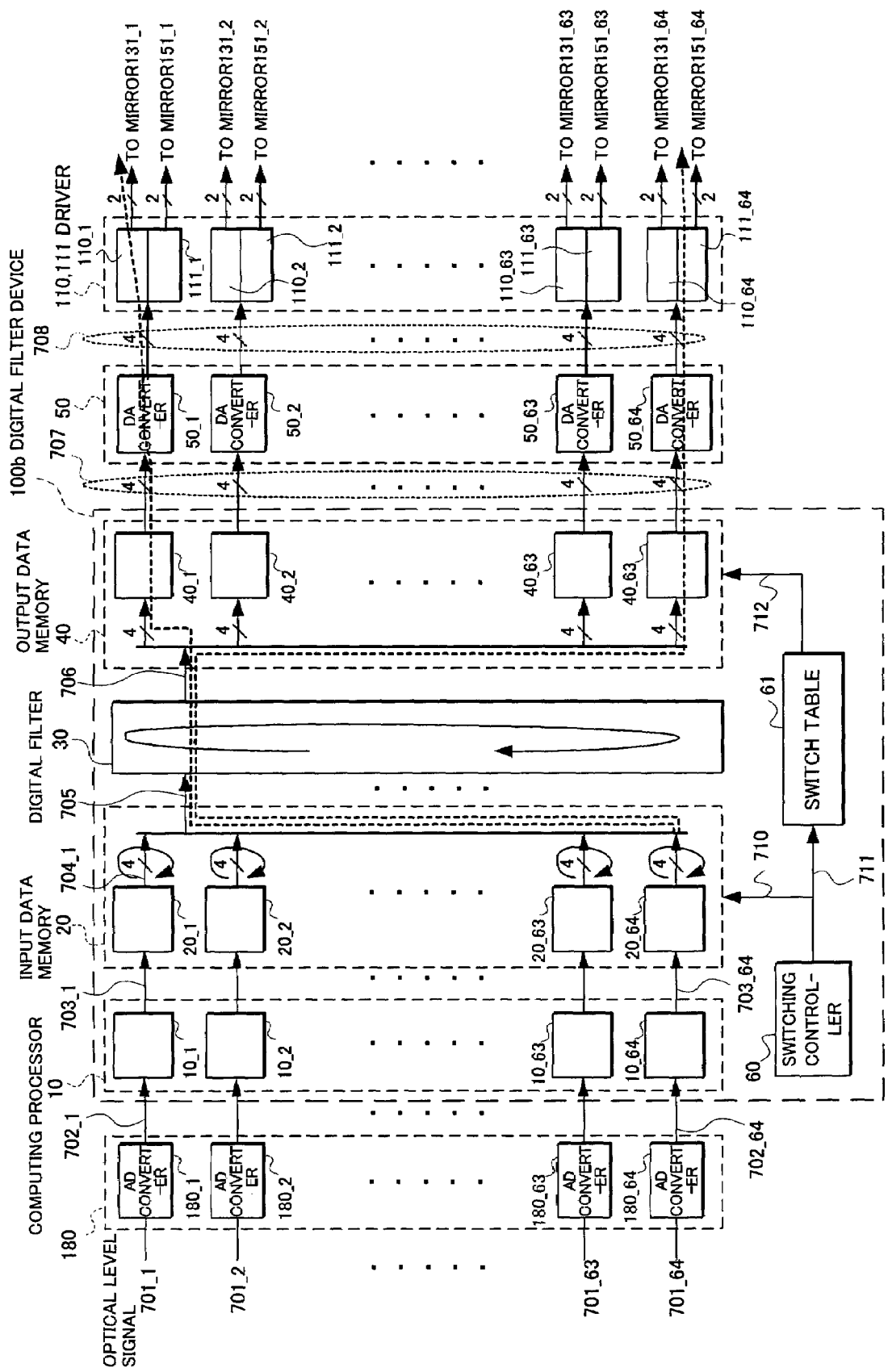
FIG. 2 is a block diagram showing an embodiment (2) of a digital filter device according to the present invention.

FIG. 2 shows an embodiment (2) which applies a digital filter device 100b according to the present invention. This embodiment (2) is different from the embodiment (1) of FIG. 1 in that a switching controller 60 and a switch table 61 are provided.

Figure 3:
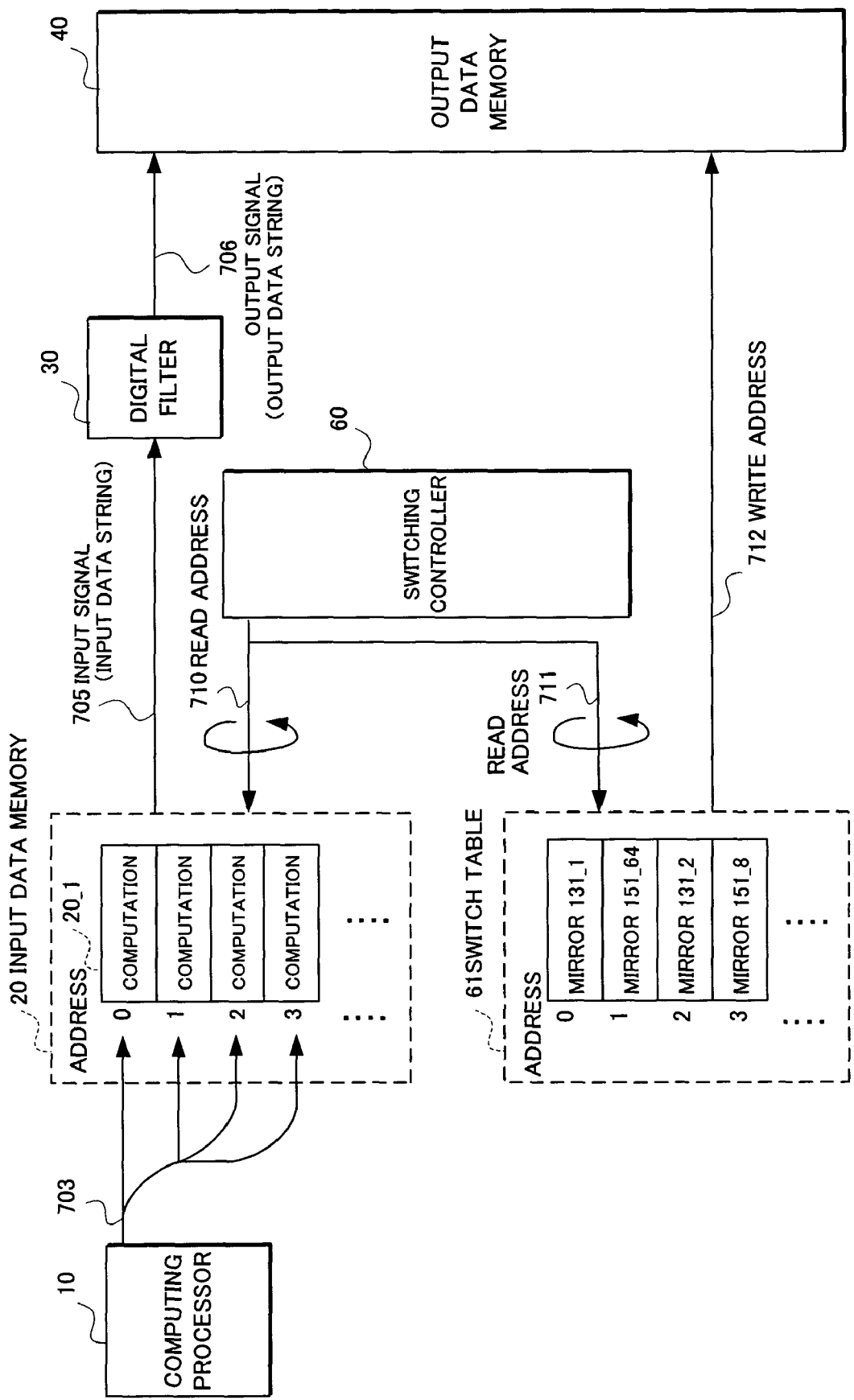
FIG. 3 is a block diagram showing a switching operation example in a digital filter device according to the present invention.

It is to be noted that in FIG. 2, the mirrors 131 and 151 and the optical level detector 170 shown in FIG. 1 are not shown for FIG. 3 shows a switching processing example by the switching controller 60, and specifically shows a transmission/reception relationship between addresses and data in the computing processor 10, the input data memory 20, the digital filter 30, the output data memory 40, and the switch table 61 shown in FIG. 2.

In the switch table 61, mirror Nos. (131_1, 151_64, . . . etc.) corresponding to the input data strings (computations) 703 computed by the computing processor 10 are set as write addresses 712, corresponding to the mirror Nos., in the output data memory 40.

FIGS. 4A-4C show switching operation timings in FIG. 3.

The operation of the digital filter device 100b in the embodiment (2) will now be described referring to FIGS. 3, 4A, 4B, and 4C.

The computing processor 10 computes the input data strings 703 for controlling the mirrors to be provided to the input data memory 20. The input data memory 20 sequentially stores the input data strings 703 in addresses 0, 1, 2, 3, . . . .

The switching controller 60 provides a processing cycle address (read address) 710="0" and a switch table read address 711="0" respectively to the input data memory 20 and the switch table 61 (see FIGS. 4A and 4B).

It is to be noted that while the embodiment (2) sets addresses for storing respective data in the input data memory 20 and the switch table 61 so that the read addresses 710 and 711 may be the same addresses, they may be of mutually different addresses.

The input signal (computation) 705 read from the address "0" of the input data memory 20 is filtered by the digital filter 30 to be provided as the output data strings 706.

The output data strings 706 are written into the write address 712 of the output data memory 40 corresponding to the mirror 131_1 read from the switch table 61 (see FIG. 4C). Similarly, the input data strings (computations) stored in the addresses "1", "2", "3" . . . of the input data memory 20 are sequentially filtered by the digital filter 30 and written into the addresses of the output data memory 40 corresponding to the mirrors 151_64, 131_2, 151_8.

Accordingly, the addresses of the output data memory 40 for storing the filtering result (=output data strings) of the input data strings (computations) can be changed by changing the switch table 61. Also, the sequence of selecting the input data strings can be changed by changing the switch table 61.

Namely, it becomes possible to perform a filtering operation and a switching operation simultaneously.

Embodiment (3)

FIG. 5 shows an embodiment (3) of a digital filter device 100c according to the present invention.

This embodiment (3) is different from the embodiment (2) shown in FIG. 2 in that the digital filter 100c is further provided with filter memories 62_1-62_64 (hereinafter, occasionally represented by a reference numeral 62) for storing, for every input data string, data-under-calculation stored in the delay memories 32_1 and 32_2 in the digital filter 30, and is provided with a switching controller 60a and a switch table 61a instead of the switching controller 60 and the switch table 61. It is to be noted that each of the filter memories 62 shown in FIG. 5 stores four input data strings.

The basic operation of the switching controller 60a is the same as the operation of the switching controller 60.

The switch table 61a is different from the switch table 61 shown in FIG. 3 in that a write address 713 for storing data-under-calculation is also set in the table in addition to the address of the output data memory which stores the output data strings 706.

FIGS. 4D-4F show examples of write timings and read timings for the filter memory 62 in the embodiment (3). Operation during filtering will now be described referring to FIGS. 4D-4F, and FIG. 5.

The switch table 61a stores data-under-calculation of the delay memories (delay circuits) 32_1 and 32_2, in the digital filter 30, of the input data string (data string corresponding to e.g. mirror 131_1) during filtering before shifting to the filtering for the subsequent input data string 705 (see 715_1 and 715_2 of write data (data-under-calculation) in FIGS. 4D, 4E, and FIG. 5). The write address 713 at this time is set in the switch table 61.

When starting the filtering for the subsequent input data string corresponding to e.g. the mirror 131_1, the switch table 61 restores data-under-calculation of the delay memories 32_1 and 32_2 upon the last filtering for the mirror 131_1, to the delay memories 32_1 and 32_2 from the filter memory 62_1 (see signals 716_1 and 716_2 in FIGS. 4D, 4F, and FIG. 5). A read address 714 at this time is the same as the write address 713 set in the switch table 61.

Thus, when the state of the mirror 131_1, for example, transitions from "during filtering" to "stop filtering", another mirror 151_64 and the like sequentially transition to "during filtering", and then the mirror 131_1 returns to "start filtering", it becomes possible to keep filtering continuity in the mirror 131_1 by restoring the last data-under-calculation of the mirror 131_1 to the delay memories 32_1 and 32_2.

Embodiment (4)

Figure 6:
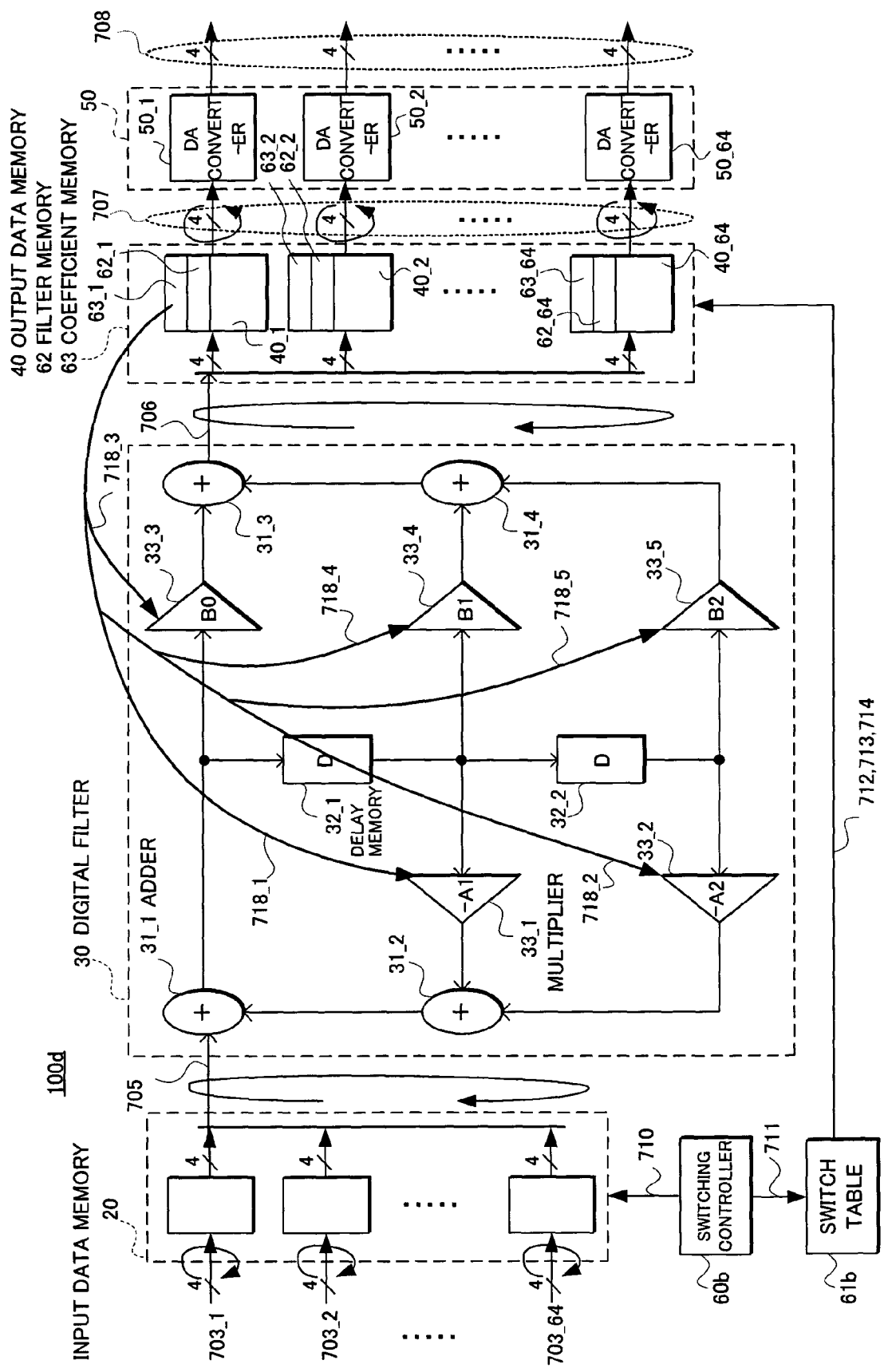
FIG. 6 is a block diagram showing an embodiment (4) of a digital filter device according to the present invention.
Figure 7:
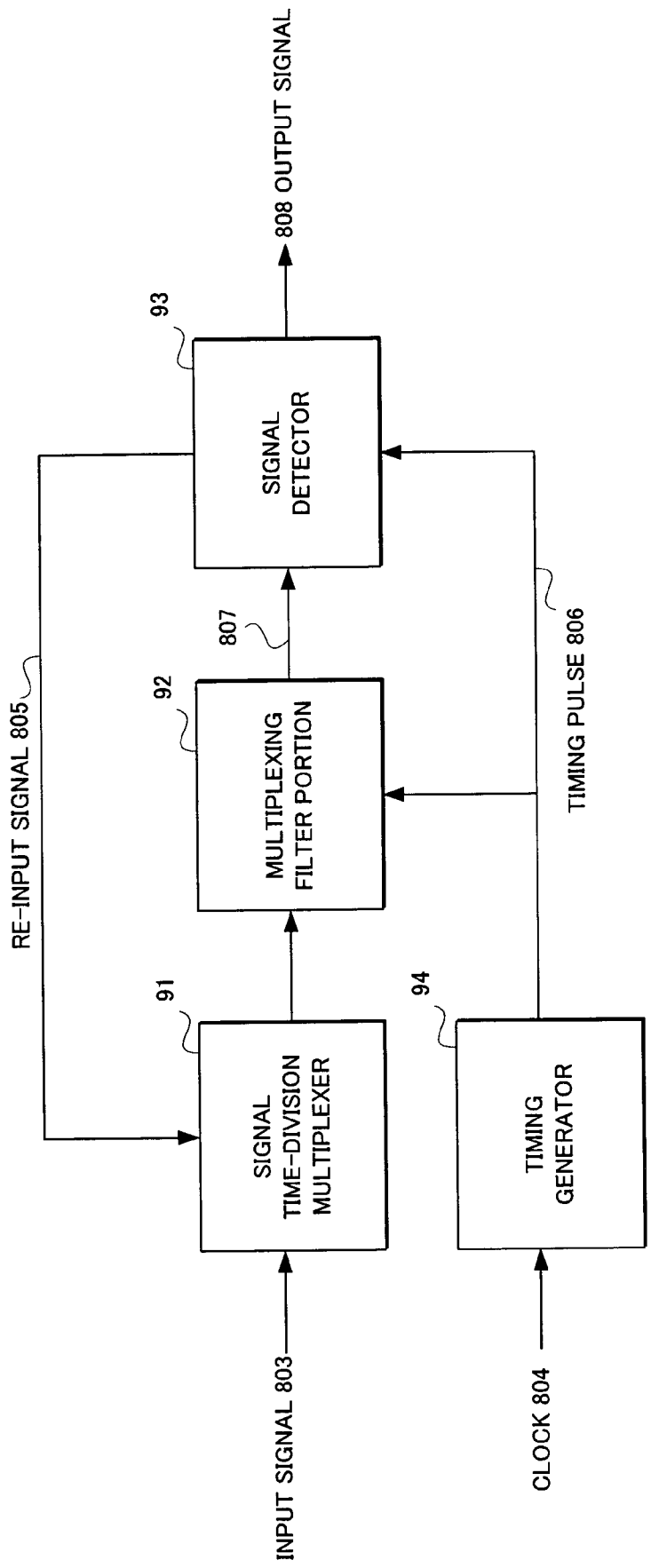
FIG. 7 is a block diagram showing an arrangement (1) of a prior art digital filter.
Figure 8:
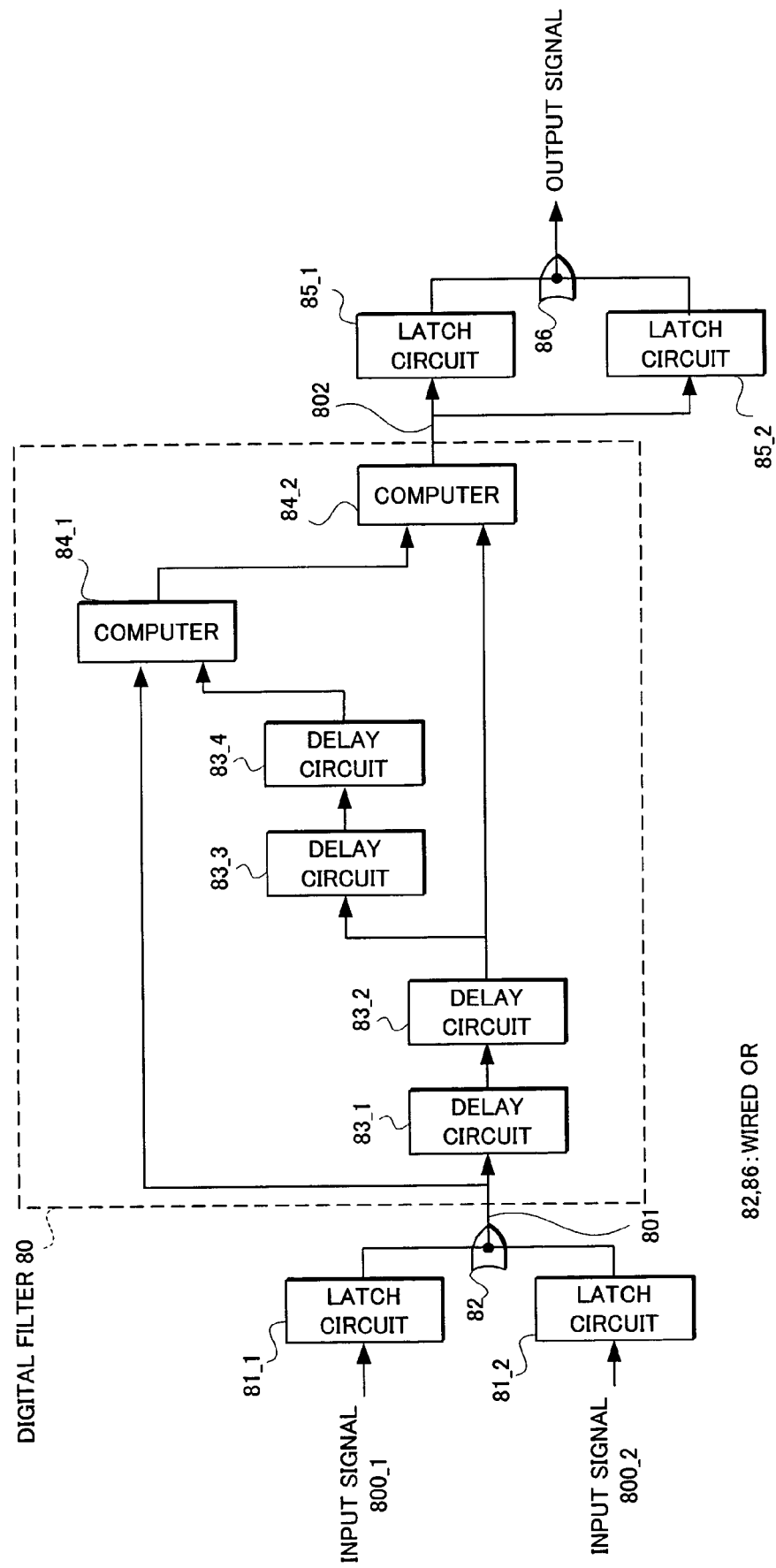
FIG. 8 is a block diagram showing an arrangement (2) of a prior art digital filter.
Figure 9:
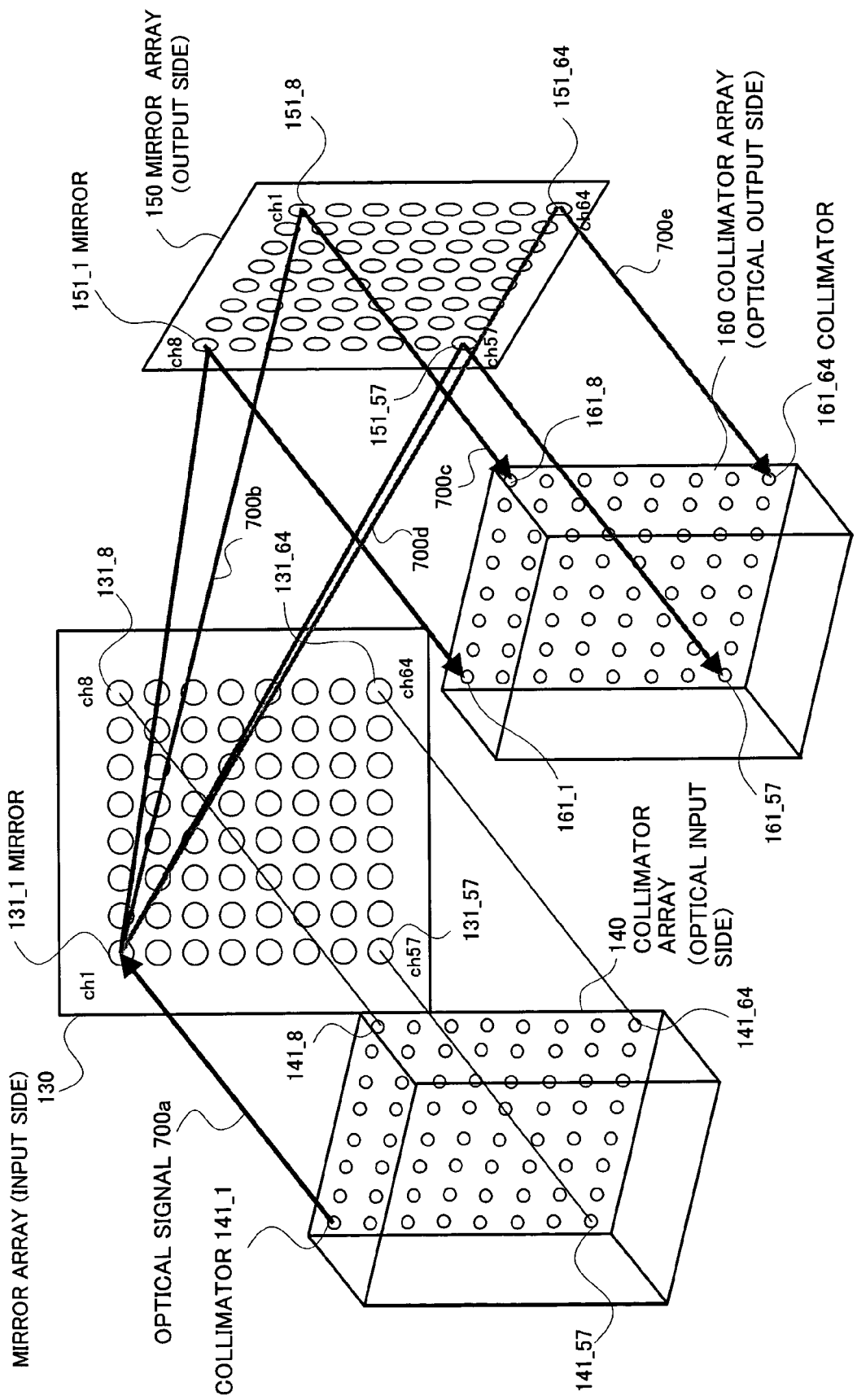
FIG. 9 is a diagram showing an arrangement of a general 64 ch×64 ch MEMS optical switch.
Figure 10:
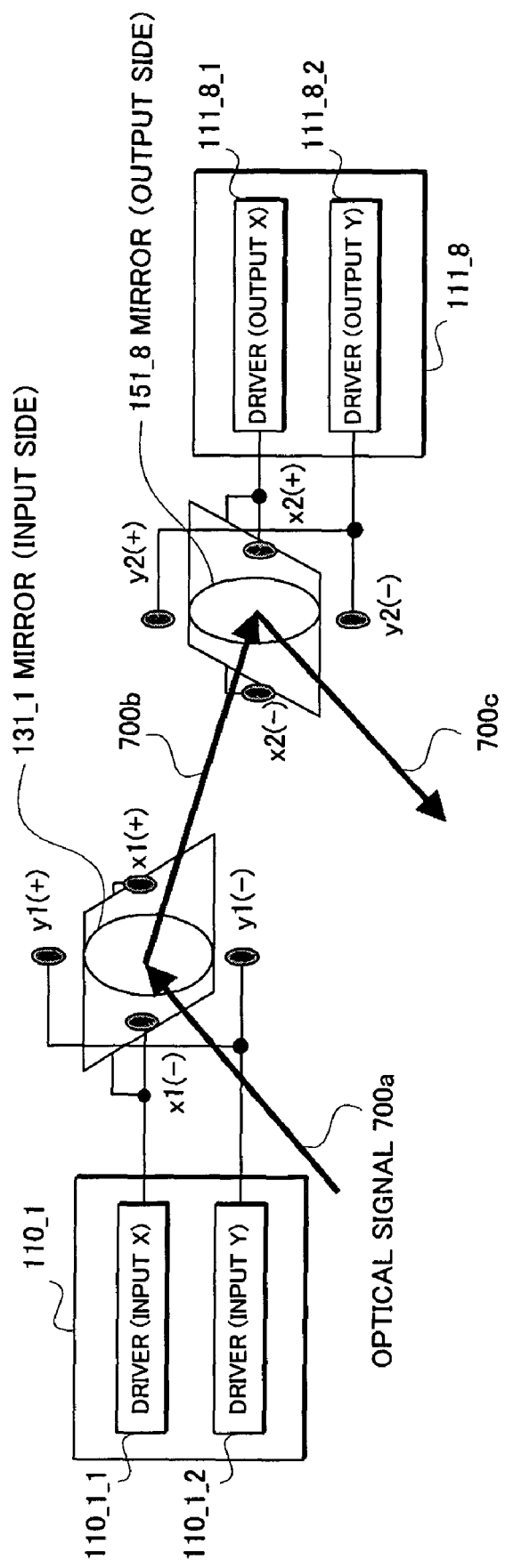
FIG. 10 is a diagram showing a configuration of mirror control electrodes in a general MEMS optical switch.

FIG. 6 shows an embodiment (4) of a digital filter device 100d according to the present invention.

This embodiment (4) is different from the embodiment (3) shown in FIG. 5 in that coefficients memories 63_1-63_64 (hereinafter, occasionally represented by a reference numeral 63) for storing a coefficient of the digital filter corresponding to each input data string 705 are further provided, and a switching controller 60b and a switch table 61b are provided instead of the switching controller 60a and the switch table 61a.

The basic operation of the switching controller 60b is the same as the operation of the switching controller 60a. The switch table 61b is different from the switch table 61a in that an address for storing the filter coefficient corresponding to each input data string 705 is set in the table in addition to the address of the output data memory 40 and the filter memory 62 corresponding to each input data string 705.

In operation, the switch table 61b provides a filter coefficient read address 717 to the coefficient memory 63 before starting the filtering for the input data string 705 corresponding to e.g. the mirror 131_1, and sets filter coefficients (−A1, −A2, B0, B1, B2) 718_1-718_5 corresponding to the filtering for the mirror 131_1 in the multipliers 33_1-33_5.

Thus, it becomes possible to perform a mirror control corresponding to an operation characteristic which depends on the mirrors 131 and 151.

As described above, a digital filter device according to the present invention is arranged such that an input data memory stores input data strings generated by computing processors, and a digital filter reads the input data strings in a predetermined order to be filtered and generates output data strings. Therefore, it becomes possible to separate an operation timing with which the computing processor generates the input data strings from an operation timing with which the digital filter filters the input data strings, and it becomes easy to facilitate designing the digital filter device (timing design, circuit design, or the like), adding a computing processor, and controlling the number of input data strings (channels).

Also, the digital filter device according to the present invention is arranged such that an output data memory stores the output data strings, and a data processor reads the output data strings in a predetermined order to be processed. Therefore, it becomes easy to facilitate designing the digital filter device, and controlling the number of output data strings (channels) of the data processor.

Also, the digital filter device according to the present invention is arranged such that a switch table for associating an address of the input data memory in which the input data strings are stored with an address of the output data memory in which the output data strings are stored is provided, and based on this switch table, a switching controller provides timings of reading the input data strings out of the input data memory and of writing the input data strings as the output data strings into the output data memory through the digital filter. Therefore, it becomes possible to designate the sequence of filtering the input data strings based on the switch table, and to switch the output data strings to a predetermined data processor corresponding to the input data strings.

Also, the digital filter device according to the present invention is arranged such that a filter memory stores data-under-calculation in a delay circuit included in the digital filter. Therefore, it becomes possible to perform continuous filtering.

Also, the digital filter device according to the present invention is arranged such that coefficient memories store a filter coefficient corresponding to each input data string of the digital filter. Therefore, it becomes possible to perform filtering corresponding to each input data string.

Namely, the use of the digital filter device according to the present invention enables filtering and switching with a sampling period. Also, storing data-under-calculation in filtering and a filter coefficient enables filter circuits to be commonized.

Also, it becomes possible to reduce design man-hours upon addition or change of the number of channels, and to reduce a circuit scale, cost, and power consumption.

Furthermore, the digital filter device according to the present invention can flexibly accommodate to a large-scale filtering circuit such as an MEMS optical switch, and also a system such as an IP network and a mobile network in which periodicity of filtering data and a sequence of time-divided channels are changed.

What we claim is:

1. A digital filter device comprising:
    one or more computing processors for generating input data strings;
    an input data memory for storing the input data strings;
    a single digital filter for reading the input data strings out of the input data memory to be filtered and for generating output data strings;
    an output data memory for storing the output data strings generated by the digital filter;
    a switch table for associating an address of the input data memory in which the input data strings are stored with an address of the output data memory in which the output data strings are stored; and
    a switching controller for providing variable timings of reading the input data strings out of the input data memory based on the switch table and of writing the input data strings as the output data strings in the output data memory through the digital filter.

2. The digital filter device as claimed in claim 1, further comprising;
    a data processor for reading the output data strings stored in the output data memory in a predetermined order to be processed.

3. The digital filter device as claimed in claim 1, further comprising;
    a filter memory for storing data-under-calculation upon filtering for a first input data string before filtering for a second input data string from filtering for the first input data string, in a delay circuit included in the digital filter, and for restoring the data-under-calculation to the delay circuit when filtering the input data string subsequent to the first input data string is started.

4. The digital filter device as claimed in claim 1, further comprising;
    one or more coefficient memories for storing a filter coefficient corresponding to each input data string of the digital filter,
    a filter coefficient corresponding to an input data string to be filtered being set in the digital filter.

* * * * *